United States Patent
Hermerding

(10) Patent No.: US 7,290,401 B2
(45) Date of Patent: Nov. 6, 2007

(54) DYNAMIC COOLING OF COMPUTING SYSTEMS

(75) Inventor: James G. Hermerding, San Jose, CA (US)

(73) Assignee: Intel Corporation, Santa Clara, CA (US)

( * ) Notice: Subject to any disclaimer, the term of this patent is extended or adjusted under 35 U.S.C. 154(b) by 386 days.

(21) Appl. No.: 10/777,234

(22) Filed: Feb. 11, 2004

(65) Prior Publication Data

US 2005/0172650 A1    Aug. 11, 2005

(51) Int. Cl.
*F25D 17/04* (2006.01)
(52) U.S. Cl. .................. 62/186; 62/259.2; 236/49.3
(58) Field of Classification Search ............... 236/49.3, 236/49.2; 454/184; 62/186, 259.2; 702/113; 165/80.2, 80.3, 59
See application file for complete search history.

(56) References Cited

U.S. PATENT DOCUMENTS

| | | | | |
|---|---|---|---|---|
| 5,706,668 A | * | 1/1998 | Hilpert | .............. 62/259.2 |
| 5,768,104 A | * | 6/1998 | Salmonson et al. | ......... 361/704 |
| 5,921,087 A | | 7/1999 | Bhatia et al. | |
| 6,082,623 A | * | 7/2000 | Chang | .................. 236/49.3 |
| 6,134,108 A | * | 10/2000 | Patel et al. | ............... 361/695 |
| 6,157,538 A | | 12/2000 | Ali et al. | |
| 6,167,947 B1 | * | 1/2001 | Hokanson et al. | ......... 165/80.3 |
| 6,246,969 B1 | * | 6/2001 | Sinclair et al. | ............. 702/113 |
| 6,493,223 B1 | * | 12/2002 | Viswanath et al. | ......... 361/690 |
| 6,639,794 B2 | * | 10/2003 | Olarig et al. | ............... 361/687 |
| 2002/0087903 A1 | | 7/2002 | Hermerding et al. | |
| 2003/0053293 A1 | * | 3/2003 | Beitelmal et al. | .......... 361/687 |
| 2004/0128101 A1 | | 7/2004 | Hermerding, II | |

* cited by examiner

*Primary Examiner*—Frantz Jules
*Assistant Examiner*—Huseyin Koca
(74) *Attorney, Agent, or Firm*—Blakely, Sokoloff, Taylor & Zafman LLP

(57) ABSTRACT

Systems and methods of operating a cooling system provide for determining one or more cooling requirements of a computing system and controlling one or more vent valves of the cooling system based on the cooling requirements. In one approach, the cooling requirements are determined based on operating system state data and/or power management data.

1 Claim, 4 Drawing Sheets

FIG. 1
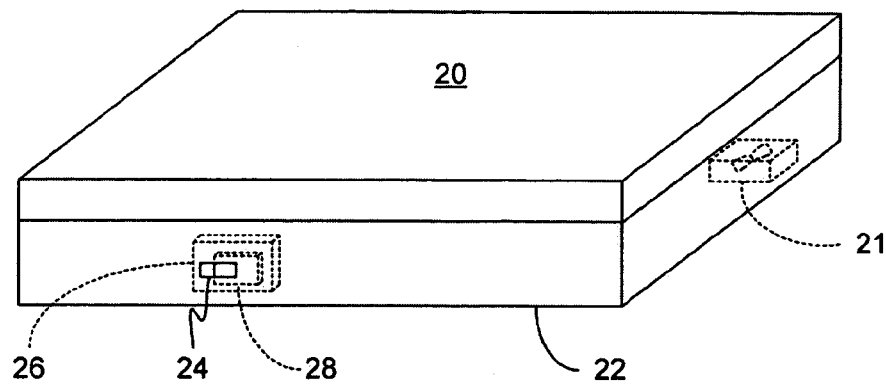
FIG. 2
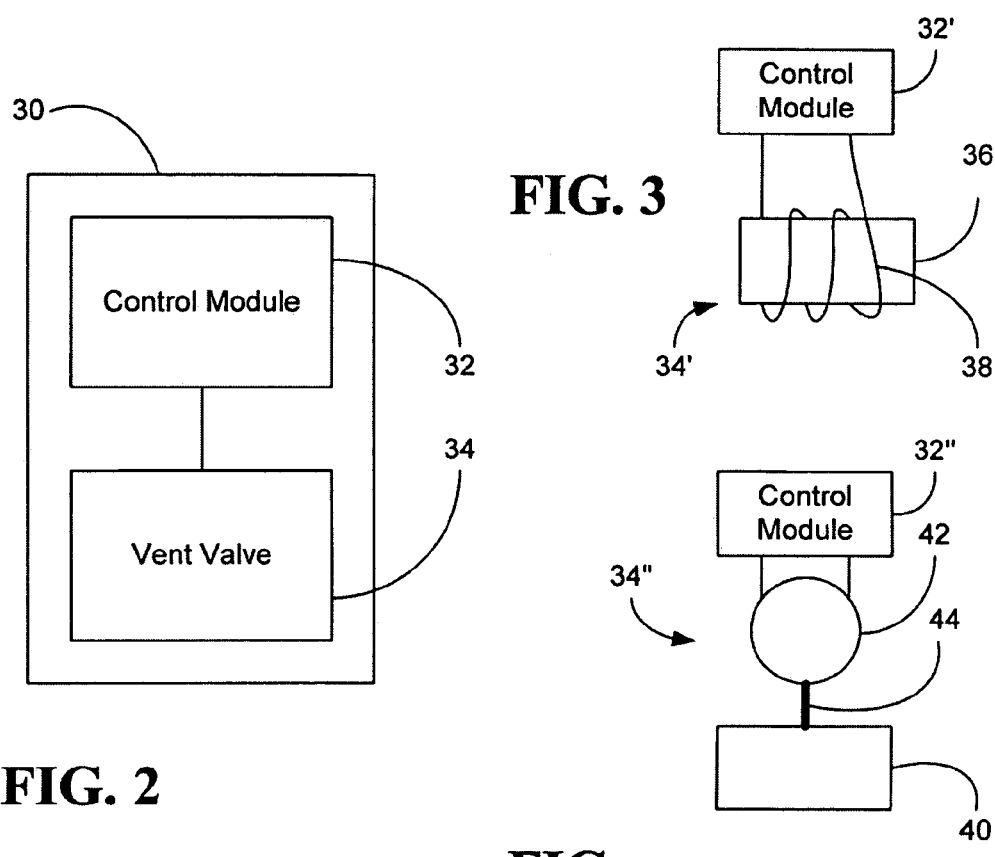
FIG. 3
FIG. 4

FIG. 5
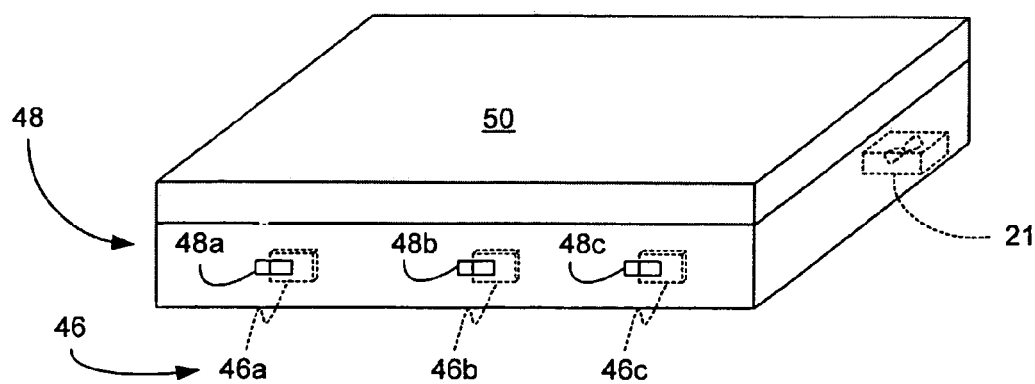
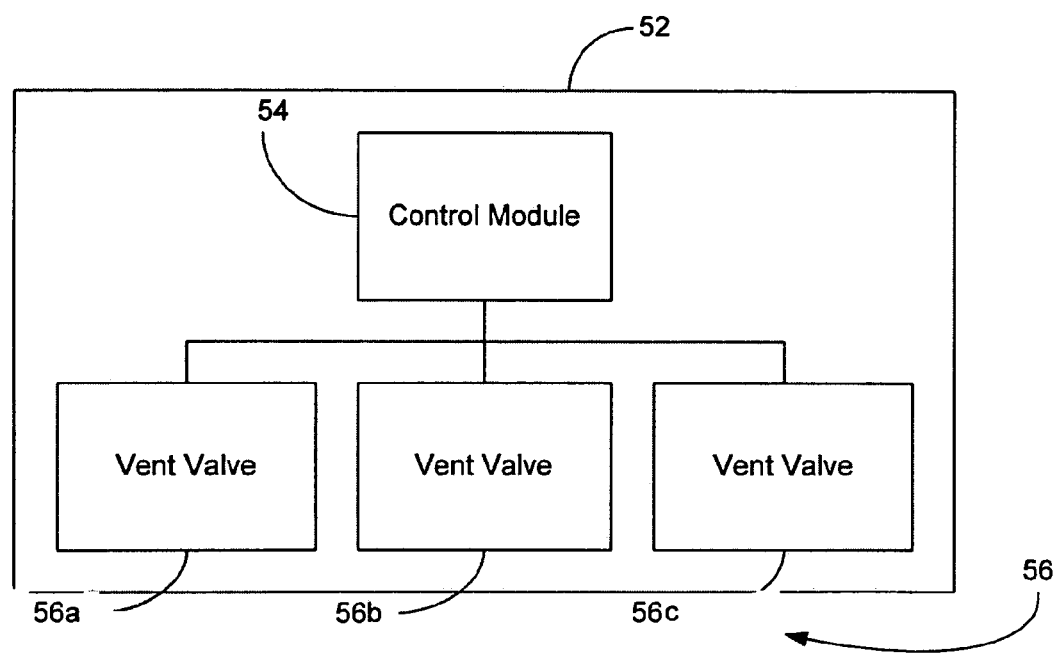
FIG. 6

FIG. 9
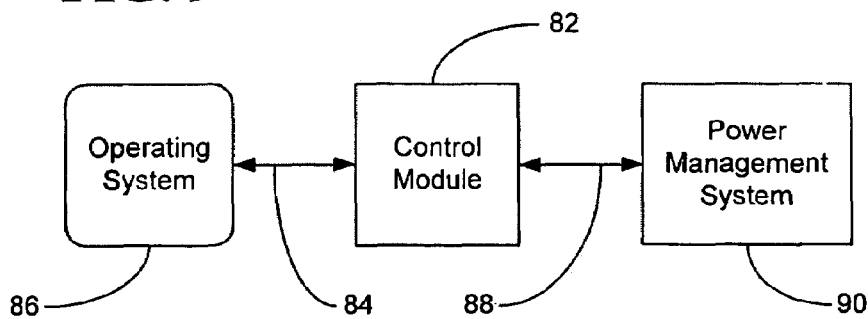
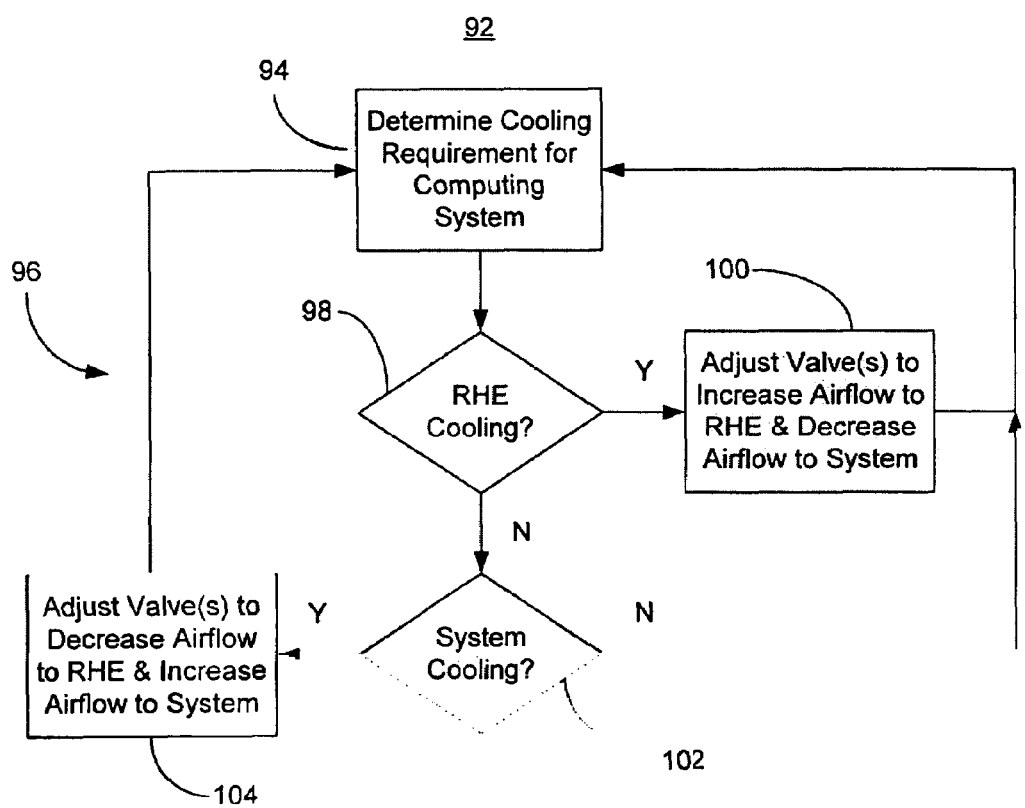
FIG. 10

DYNAMIC COOLING OF COMPUTING SYSTEMS

BACKGROUND

1. Technical Field

Embodiments of the present invention generally relate to cooling systems. More particularly, embodiments relate to dynamically cooling computing systems.

2. Discussion

As society continues to become more mobile, the demand for enhanced mobile computing systems also grows. Indeed, the desirability of features such as wireless networking and digital imaging has spurred an unparalleled increase in the use of systems such as notebook (or laptop) computers, handheld personal digital assistants (PDAs) and wireless smart phones. Other types of computing systems such as desktop computers, servers and set-top boxes have also been associated with an escalation in functionality and use. While adding features to computing systems has likely increased the marketability of these systems, it has been determined that the additional power workload associated with these features can negatively affect processing performance and/or battery life.

For example, the temperature increases that commonly accompany feature-rich mobile computing have been a recent area of concern. As components consume more power, they generate heat, which can slow down transistor switching and increase the drain of current on the power supply. While conventional notebook computers often make use of strategically located and sized vents to address these temperature concerns by increasing the amount of airflow through the system, a number of difficulties remain.

In particular, the power workloads and associated optimum cooling requirements in a mobile computing system often change as the use of the mobile computing system changes. For example, the use of a computing system's wireless networking functionality may result in the generation of heat in an entirely different set of components than the use of the computing system's digital imaging functionality. The location and sizing of conventional vents in mobile computing systems, however, is static and typically does not change once the system is designed and constructed. As a result, a computing system having a vent scheme that is optimized for one usage profile may experience less than optimum performance and battery life for another usage profile.

BRIEF DESCRIPTION OF THE DRAWINGS

The various advantages of the embodiments of the present invention will become apparent to one skilled in the art by reading the following specification and appended claims, and by referencing the following drawings, in which:

FIG. 1 is a perspective view of a mobile computing system according to one embodiment of the invention;

FIG. 2 is a block diagram of a cooling system according to one embodiment of the invention;

FIG. 3 is a schematic diagram of a vent valve according to one embodiment of the invention;

FIG. 4 is a schematic diagram of a vent valve according to an alternative embodiment of the invention;

FIG. 5 is a perspective view of a mobile computing system according to an alternative embodiment of the invention;

FIG. 6 is a block diagram of a cooling system according to an alternative embodiment of the invention;

FIG. 9 is a block diagram of a cooling system control module according to one embodiment of the invention;

FIG. 10 is a flowchart of a method of operating a cooling system according to one embodiment of the invention.

DETAILED DESCRIPTION

Figure 7:
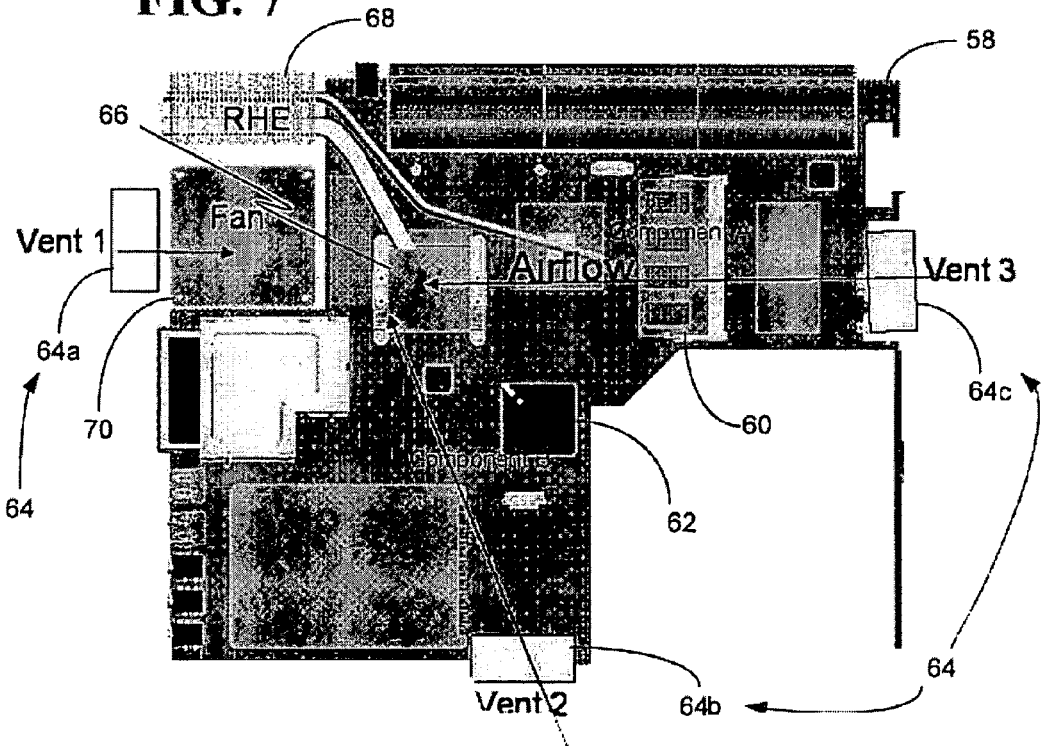
FIG. 7 is a plan view of a component cooling scheme according to one embodiment of the invention.

Systems and methods provide for the operation of a cooling system in which one or more cooling requirements of a computing system are determined and one or more vent valves of the cooling system are controlled based on the cooling requirements. A dynamic cooling approach therefore effectively deals with the varying power workloads and usage profiles that computing systems such as desktop computers, servers, set-top boxes, notebook computers, personal digital assistants (PDAs) and wireless smart phones can experience.

FIG. 1 shows a mobile computing system 20 having a fan 21 and a housing 22 with surfaces defining a vent aperture 24. The housing 22 can also have surfaces defining a vent aperture (not shown) near the fan 21, where the fan 21 can be designed to force air into or out of the computing system 20. The computing system 20 also has a cooling system 26 with a vent valve 28 disposed adjacent to the vent aperture 24. The airflow resistance of the vent valve 28 can be adjusted, either automatically or manually, to accommodate different cooling requirements, which may result from varying power workloads, usage profiles, etc. For example, the vent aperture 24 and vent valve 28 may be in proximity to a heat generating component such as a processor (not shown), where the processor needs maximum airflow when in use and little or no airflow when not in use. In such a case, the vent valve 28 can be controlled accordingly.

While some examples make reference to notebook computers for the purposes of discussion, it should be noted that the embodiments of the present invention are not so limited. Indeed, other types of enclosed computing systems such as desktop computers, servers, set-top boxes PDAs and wireless smart phones can readily benefit from the principles described herein. Notwithstanding, there are a number of aspects of notebook computers for which the embodiments are well suited.

Turning now to FIG. 2, one approach to a cooling system 30 is shown in greater detail. The cooling system 30, which can readily be substituted for the cooling system 26 (FIG. 1) discussed above, represents an automated approach to cooling. The cooling system 30 has a control module 32, which determines a cooling requirement of a computing system (not shown). A vent valve 34 is coupled to the control module 32, where the control module 32 controls the vent valve 34 based on the cooling requirement. For example, the control module 32 could increase the airflow resistance of the vent valve 34 to decrease the cooling of components in proximity to the vent valve 34, or the control module 32 could decrease the airflow resistance of the vent valve 34 to increase the cooling of the components in proximity to the vent valve 34.

FIGS. 3 and 4 illustrate that the vent valve can be constructed in a number of different ways. For example, FIG. 3 shows a vent valve 34' that has a movable airflow barrier 36 and a solenoid coil 38 operatively coupled to the airflow barrier 36 via a magnetic connection. In the illustrated example, the control module 32' can selectively send an excitation signal through the solenoid coil 38 to either actuate or de-actuate the vent valve 34', where an adjustment in the airflow resistance of the vent valve 34' results. The physical shape of the airflow barrier 36 can vary depending upon the size of the corresponding vent or vents.

Alternatively, FIG. 4 shows a vent valve 34" that includes a movable airflow barrier 40 and a motor 42 operatively coupled to the airflow barrier 40 via a mechanical connection 44. The control module 32" therefore controls the motor 42 to either actuate or de-actuate the vent valve 34" to whatever extent desired. It should be noted that other approaches such as micro-electromechanical systems (MEMS) and nanotechnology, can be readily used depending upon the form factor (i.e., size) of the computing system, the necessary degrees of actuation, the airflow requirements, and so on. For example, if it is determined that the control over the airflow resistance needs to be fully variable (e.g., more than simply open or closed), an approach similar to vent valve 34" may be desired. On the other hand, if it is determined that the control over the airflow resistance can be binary (e.g., either open or closed) in nature, an approach similar to vent valve 34' (FIG. 3) may be desired.

Turning now to FIG. 5, a mobile computing system 50 having a cooling system with a plurality of vent valves 46 (46a-46c) is shown, where each vent valve 46 is adjacent to at least one vent aperture 48 (48a-48c) to provide for adjustment of airflow throughout the computing system 50. As already discussed, the vent valves 46 may be either manually operated or automatically controlled by device such as the control modules discussed above. It should be noted that the particular location and placement of the vent apertures 48 and vent valves 46 can vary depending upon the circumstances. For example, internal component placement may dictate that some or all of the vent apertures 48 and vent valves 46 be positioned on the bottom surface, top surface or other side surfaces of the mobile computing system 50. It should also be noted that a one-to-one relationship between the vent apertures 48 and the vent valves 46 may not be necessary. Indeed, the number of vent apertures could be greater than the number of vent valves and vice versa.

FIG. 6 illustrates a cooling system 52 having a control module 54 and a plurality of automatically controlled vent valves 56 (56a-56c), where the control module 54 adjusts the airflow resistance of one or more of the vent valves 56 to meet at least one cooling requirement. As will be discussed below, the cooling requirement may indicate that an individual component such as a microprocessor or other heat generating component needs increased cooling, or that the overall system (e.g., a set of components) needs increased cooling. In another example, the cooling requirement may selectively identify one of a plurality of components in need of increased cooling.

Turning now to FIG. 7, a component cooling scheme is shown to more fully demonstrate the dynamic cooling techniques described herein. The illustrated circuit board 58 has a plurality of components, which include a first component 60, a second component 62 and a third component, where the third component is a processor die 66 having a remote heat exchanger (RHE) 68 coupled to a heat-generating surface of the processor die 66. The first and second components 60, 62 can be viewed as "system components", where the circuit board 58 may be part of a mobile computing system such as computing system 50 (FIG. 5), a desktop computer, a server, a set-top box, etc. The computing system may also have a fan 70 and a housing (not shown) with surfaces defining a plurality of vent apertures 64 (64a-64c), where each vent aperture 64 corresponds to either a manually or automatically adjustable vent valve (not shown) as already discussed.

By increasing the airflow resistance of the vent valve associated with vent aperture 64a and decreasing the airflow resistances of the vent valves associated with vent apertures 64b and 64c, system-level cooling is optimized. Alternatively, by decreasing the airflow resistance of the vent valve associated with vent aperture 64a and increasing the airflow resistances of the vent valves associated with vent apertures 64b and 64c, the processor die 66 and RHE 68 are supplied with more external ambient air, which enables increased performance of the processor die 66.

Returning now to FIG. 6, it will be appreciated that alternative dynamic cooling schemes can be used. For example, each vent valve 56 can be positioned adjacent to a vent aperture (not shown) and a corresponding individual heat-generating component (not shown). The control module 54 can selectively open the vent valve that corresponds to the "hot" component and close the vent valve that corresponds to the other components as needed. Thus, the cooling system can select between individual components as well as between individual component cooling and system-level cooling. The cooling system can also selectively cool multiple sub-systems. For example, each vent valve 56 could be positioned adjacent to a set of components, where the control module 54 opens the vent valve that corresponds to the hot sub-system. Simply put, each set can include one or more components without parting from the spirit and scope of the embodiments shown.

Figure 8:
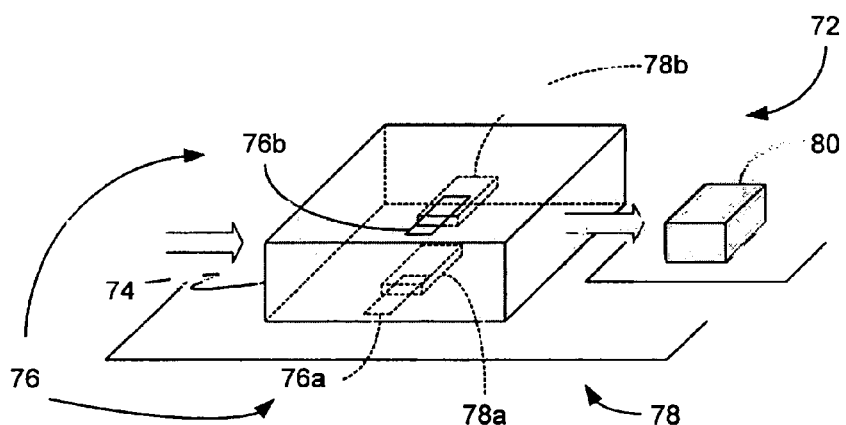
FIG. 8 is a perspective view of a cooling system fan according to one embodiment of the invention.

In yet another example, FIG. 8 shows a fan 72 having a chassis 74 with surfaces defining a plurality of vent apertures (or inlets) 76 (76a, 76b), where the cooling system has a plurality of vent valves 78 (78a, 78b) corresponding to the plurality of vent apertures 76. The output of the fan 72 is directed toward an individual component 80 known to be a source of performance-depleting heat during one or more usage models/modes of operation (e.g., when active). The bottom vent valve 78a is positioned near an external surface of the computing system, whereas the top vent valve 78b is positioned near the internal components of the computing system. A control module (not shown) can adjust the airflow resistance of one or more of the plurality of vent valves 78 to meet the cooling requirements as already described.

For example, decreasing the airflow resistance of the bottom vent valve 78a and increasing the airflow resistance of the top vent valve 78b provides a substantial amount of external ambient air to the active individual component 80, and therefore helps to maximize the performance of the individual component 80. On the other hand, increasing the airflow resistance of the bottom vent valve 78a and decreasing the airflow resistance of the top vent valve 78b maximizes system-level cooling. In yet another example, decreasing the airflow resistance of both vent valves 78a and 78b, provides a mix of active component and system-level cooling.

Turning now to FIG. 9, a control module 82 is shown. The control module 82 can be readily substituted for the control module 32 (FIG. 2) or control module 54 (FIG. 6) discussed above. In the illustrated example, the control module 82 can determine cooling requirements based on state data 84 from an operating system (OS) 86 and/or power management data 88 from a power management system 90. For example, the OS state data 84 may indicate that certain applications are active, where the control module 32 can determine the cooling requirements by identifying heat-generating components/resources that correspond to the active applications.

In addition, the power management data 88 can more directly identify the components of the mobile computing system in need of increased cooling. The particular manner in which the control module 82 determines the cooling requirements can vary and is not dependent upon any specific technique.

FIG. 10 shows a method 92 of operating a cooling system. The method 92 can be implemented using a wide variety of commercially available hardware and/or software programming techniques as a cooling system control module. For example the method 92 could be incorporated into an application specific integrated circuit (ASIC) or a set of instructions to be stored in a machine-readable medium such as read only memory (ROM), random access memory (RAM), flash memory, etc. The instructions can be included in OS software, driver software, application software, and so on.

It can be seen that one or more cooling requirements of a mobile computer system are determined at processing block 94 and one or more vent valves of the cooling system are controlled at blocks 96 based on the cooling requirements. Controlling the vent valves can include adjusting the airflow resistance of the vent valves as needed. In particular, block 98 provides for determining whether the cooling requirements indicate a need for increased cooling of an individual component such as an RHE-coupled component. If so, the adjusting at block 100 involves increasing the airflow to the individual component and decreasing the airflow to the remaining system components. Block 102 provides for determining whether the cooling requirements indicate a need for increased system cooling (e.g., cooling of a set of components). If so, the adjusting at block 104 involves decreasing the airflow to the individual component and increasing the airflow to the system components.

The process of dynamically adjusting airflow to components within an enclosed computing system such as a desktop computer, a server, a set-top box, a notebook computer, a personal digital assistant and a smart phone therefore provides a unique solution to the challenges presented by enhanced functionality on mobile platforms. In particular, combining power management data, OS state data and/or other cooling requirements with adjustable vent valves can result in substantial performance improvements and/or longer battery life.

Those skilled in the art can appreciate from the foregoing description that the broad techniques of the embodiments of the present invention can be implemented in a variety of forms. Therefore, while the embodiments of this invention have been described in connection with particular examples thereof, the true scope of the embodiments of the invention should not be so limited since other modifications will become apparent to the skilled practitioner upon a study of the drawings, specification, and following claims.

What is claimed is:

1. A computing system comprising:
a housing having surfaces defining a vent aperture;
a cooling system having a vent valve disposed adjacent to the vent aperture to adjust flow of external ambient air to cool one or more components of the computing system;
wherein the cooling system includes a control module to determine a cooling requirement for the computing system and to control the vent valve based on the cooling requirement;
a first set of the one or more components; a second set of the one or more components, wherein if the cooling requirement indicates a need for increased cooling of the first set of the one or more components, the control module is to increase airflow to the first set of the one or more components and decrease airflow to the second set of the one or more components, and if the cooling requirement indicates a need for increased cooling of the second set of the one or more components, the control module is to decrease airflow to the first set of the one or more components and increase airflow to the second set of the one or more components; and
wherein the first set includes a processor die having a remote heat exchanger coupled to a heat-generating surface of the processor die.

* * * * *